United States Patent
Rasmussen et al.

(10) Patent No.: US 6,592,724 B1
(45) Date of Patent: Jul. 15, 2003

(54) METHOD FOR PRODUCING NITIHF ALLOY FILMS BY SPUTTERING

(75) Inventors: Gregory Keller Rasmussen, Grand Blanc, MI (US); Fenglian Chang, Grand Blanc, MI (US); Jinping Zhang, Grand Blanc, MI (US); Terry Jack Gold, Davison, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/400,589

(22) Filed: Sep. 22, 1999

(51) Int. Cl.[7] .............................. C23C 14/34; B22F 1/00
(52) U.S. Cl. ........................... 204/192.15; 204/192.12; 204/298.13; 204/192.16; 204/192.17; 419/38
(58) Field of Search ..................... 204/192.12, 192.15, 204/298.13, 192.16, 192.17; 419/38

(56) References Cited

U.S. PATENT DOCUMENTS

| | | | |
|---|---|---|---|
| 4,824,481 A | 4/1989 | Chatterjee et al. ............. | 75/246 |
| 4,960,651 A | * 10/1990 | Pettigrew et al. ............ | 428/607 |
| 5,061,914 A | 10/1991 | Busch et al. ................. | 337/140 |
| 5,108,523 A | 4/1992 | Peterseim et al. .......... | 148/402 |
| 5,114,504 A | 5/1992 | AbuJudom, II et al. .... | 148/402 |
| 5,820,994 A | 10/1998 | Gotoh et al. ................ | 428/451 |
| 6,013,854 A | 1/2000 | Moriuchi ..................... | 623/11 |
| 6,033,536 A | * 3/2000 | Ichihara et al. ......... | 204/192.15 |
| 6,084,849 A | 7/2000 | Durig et al. ................ | 369/126 |
| 6,358,380 B1 | 3/2002 | Mann et al. ............. | 204/192.2 |

FOREIGN PATENT DOCUMENTS

| | | | |
|---|---|---|---|
| EP | 0 640 964 A1 | 3/1995 | ........... G11B/11/10 |
| JP | 2000-054122 | 2/2000 | |
| WO | WO 96/39547 | 12/1996 | ........... C23C/14/34 |
| WO | WO 01/21851 A1 | 3/2001 | ........... C23C/14/34 |

OTHER PUBLICATIONS

L. You, C.Y. Chung, X.D. Han and H.D. Gu; "Investigation of High Transition Temperatures NiTiHf Shape Memory Alloy Thin Films for Micro–Actuators"; Proceedings of the Second International Conference on Shape Memory and Superelastic Technologies, Asilomar Conference Center, Pacific Grove, California, USA, pp. 189–194.197.

K. Nomura, S. Miyazaki and A. Ishida, "Effect of Plastic Strain on Shape Memory Characteristics in Sputter–Deposited Ti–Ni Thin Films", Journal De Physique IV, Colloque C8, supplement au Journal de Physique III, vol. 5, Dec. 1995, pp. C8–695 to C8–700.

A. Ishida, M. Sato, A. Takei, K. Nomura, and S. Miyazaki, "Effect of Aging on Shape Memory Behavior of Ti–51.3 At. Pct Ni Thin Films", Metallurgical and Materials Transactions A, vol. 27A, Dec. 1996. pp. 3753–3759.

S. Miyazaki and K. Nomura, "Development of Perfect Shape Memory Effect in Sputter–Deposited Ti–Ni Thin Films", Proc. IEEE Micro Electro Mechanical Systems (MEMS–94), Oiso, Japan, (1994), pp. 176–181.

(List continued on next page.)

Primary Examiner—Mark F. Huff
Assistant Examiner—Daborah Chacko-Davis
(74) Attorney, Agent, or Firm—Thomas N. Twomey

(57) ABSTRACT

Disclosed is a method for producing ternary shape-memory alloy films employing sputtering process techniques using krypton as a process gas.

9 Claims, 3 Drawing Sheets

OTHER PUBLICATIONS

Akira Ishida, Morio Sato, Atsushi Takei, and Shuichi Miyazaki, "Effect of Heat Treatment on Shape Memory Behavior of Ti–rich Ti–Ni Thin Films", Materials Transactions, JIM, vol. 36, No. 11 (1995), pp. 1349–1355.

S.A. Mathews, Manfred Wuttig, and Quanmin Su, "The Effect of Substrate Constraint on the Martensitic Transformation of Ni–Ti Thin Films", Metallurgical and Materials Transactions A, vol. 27A, Sep. 1996, pp. 2859 to 2861.

X. D. Han, W. H. Zou, R. Wang. Z. Zhang, D. Z. Yang, and K. H. Wu, "The Martensite Structure and Aging Precipitates of a TiNiHf High Temperature Shape Memory Alloy", Journal De Physique IV, Colloque C8, supplement au Journal de Physique III, vol. 5, Dec. 1995, pp. C8–753 to C8–758.

D. S. Grummon and T. J. Pence, "Thermotractive Titanium–Nickel Thin Films For Microelectromechanical Systems And Active Composites", Mat. Res. Soc. Symp. Proc. vol. 459 1997 Materials Research Society, pp. 331 to 343.

D. S. Grummon, Li Hou, Z. Zhao, and T.J. Pence, "Progress on Sputter–Deposited Thermotractive Titanium–Nickel Films", Journal De Physique IV, Colloque C8, supplement au Journal de Physique III, vol. 5, Dec. 1995, pp. C8–665 to C8–670.

A.D. Johnson, V. V. Martynov, and R. S. Minners, "Sputter Deposition of High Transition Temperature Ti–Ni–Hf Alloy Thin Films", Journal De Physique IV, Colloque C8, supplement au Journal de Physique III, vol. 5, Dec. 1995, pp. C8–783 to C8–801.

U.S. patent application Ser. No. 09/400,581, Rasmussen et al., filed Sep. 1999.*

* cited by examiner

METHOD FOR PRODUCING NITIHF ALLOY FILMS BY SPUTTERING

TECHNICAL FIELD

This invention relates to a method of producing ternary shape-memory alloy films by sputtering process techniques. In particular, it relates to a method of producing nickel-titanium-hafnium shape-memory alloy films by sputtering process techniques using krypton as a process gas.

BACKGROUND OF THE INVENTION

Various metallic materials capable of exhibiting shape-memory characteristics are well known in the art. These shape-memory capabilities occur as the result of the metallic alloy undergoing a reversible crystalline phase transformation from one crystalline state to another crystalline state with a change in temperature and/or external stress. In particular, it was discovered that alloys of nickel and titanium exhibited these remarkable properties of being able to undergo energetic crystalline phase changes at ambient temperatures, thus giving them a shape-memory. These alloys, if plastically deformed while cool, will revert, exerting considerable force, to their original, undeformed shape when warmed. These energetic phase transformation properties render articles made from these alloys highly useful in a variety of applications. An article made of an alloy having shape memory properties can be deformed at a low temperature from its original configuration, but the article "remembers" its original shape, and returns to that shape when heated.

For example, in nickel-titanium alloys possessing shape-memory characteristics, the alloy undergoes a reversible transformation from an austenitic state to a martensitic state with a change in temperature. This transformation is often referred to as a thermoelastic martensitic transformation. The reversible transformation of the NiTi alloy between the austenite to the martensite phases occurs over two different temperature ranges which are characteristic of the specific alloy. As the alloy cools, it reaches a temperature ($M_s$) at which the martensite phase starts to form, and finishes the transformation at a still lower temperature ($M_f$). Upon reheating, it reaches a temperature ($A_s$) at which austenite begins to reform and then a temperature ($A_f$) at which the change back to austenite is complete. In the martensitic state, the alloy can be easily deformed. When sufficient heat is applied to the deformed alloy, it reverts back to the austenitic state, and returns to its original configuration.

Shape-memory materials previously have been produced in bulk form, in the shape of wires, rods, and plates, for utilities such as pipe couplings, electrical connectors, switches, and actuators, and the like. Actuators previously have been developed, incorporating shape-memory alloys or materials, which operate on the principal of deforming the shape-memory alloy while it is below its phase transformation temperature range and then heating it to above its transformation temperature range to recover all or part of the deformation, and, in the process of doing so, create moments of one or more mechanical elements. These actuators utilize one or more shape-memory elements produced in bulk form, and, therefore are limited in size and usefulness.

The unique properties of shape-memory alloys further have been adapted to applications such as micro-actuators by means of thin film technology. Micro-actuators are desirable for such utilities as opening and closing valves, activating switches, and generally providing motion for micro-mechanical devices. It is reported that the advantageous performance of micro-actuators is attributed to the fact that the shape-memory effect of the stress and strain can produce substantial work per unit of volume. For example, the work output of nickel-titanium shape-memory alloy is of the order of 1 joule per gram per cycle. A shape-memory film micro-actuator measuring one square millimeter and ten microns thick is estimated to exert about 64 microjoules of work per cycle.

The most well known and most readily available shape-memory alloy is an alloy of nickel and titanium. With a temperature change of as little as about 10° C., this alloy can exert a force of as much as 415 MPa when applied against a resistance to changing its shape from its deformation state.

Although numerous potential applications for shape-memory alloys now require materials featuring phase transformation temperatures above about 100° C., the martensite start point for the common commercially available nickel-titanium alloys barely exceeds about 80° C. In order to meet higher temperature applications, ternary alloys have been investigated, using various additional metallic elements. For example, substitution of noble metals (Au, Pd, Pt) for Ni in NiTi alloys successfully accomplishes higher temperature phase transformations, but the costs introduced are somewhat prohibitive for many commercial applications. Ternary nickel-titanium base shape-memory alloys including a zirconium or hafnium component appear to be potentially economical high temperature transformation candidates. However, particularly in either Ti(NiPd, Pt) or Ni(TiHf, Zr) systems, there exists a challenge to develop a reliable process for producing microns-thick, thin films of these high temperature shape-memory alloys.

SUMMARY OF THE INVENTION

Now, an improved method of fabricating ternary shape-memory alloys using sputtering techniques has been developed.

According to the present invention, there is provided a method for producing a thin film deposit of a ternary alloy exhibiting mechanical shape-memory characteristics by using a sputtering deposition process comprising a sputtering deposition process wherein krypton serves as a process gas.

Previously practiced sputtering deposition processes for fabricating thin films of binary shape-memory alloys, such as nickel-titanium alloys, have utilized argon as the process gas during the sputtering deposition process. Before introduction of the argon process gas as the ionizing medium during sputtering in a sputtering chamber, the chamber first is evacuated in order to avoid introduction of oxygen contamination during the process, which would adversely impact the properties of the deposited film. Oxygen has been shown to decrease transition temperatures and adversely affect the mechanical properties of the film.

Likewise, in ternary shape-memory alloy film deposition, argon typically has been employed as the process gas during sputtering. However, production of ternary shape-memory alloy thin films by sputtering techniques using argon as the process ionizing gas results in weak, brittle films that do not meet micro-actuator grade requirements. These inferior properties were not unexpected, since bulk ternary shape-memory alloys also tend to exhibit mechanical properties far inferior to bulk binary shape-memory alloys. Surprisingly, it now has been discovered that the use of krypton as a process gas significantly enhances the quality of a ternary shape-memory alloy thin film applied by sputtering deposition.

DESCRIPTION OF AN EMBODIMENT OF THE INVENTION

The subject invented process is applicable to the thin film deposition of ternary shape-memory alloys by sputtering deposition techniques. It particularly is applicable to the thin film deposition of shape-memory alloys with high transition temperatures, such as NiTi and Pd, Zr, or Hf ternary alloys, and, in specific to ternary nickel-titanium-hafnium alloys. The process parameters for sputtering deposition are dependent on the specifics of the sputtering equipment employed. In such a sputtering deposition process, a chamber typically is provided, such as a Perkin-Elmer chamber. An initial vacuum base pressure in the chamber should be about $5 \times 10^{-6}$ torr or lower. Preferably, the base pressure is about $1 \times 10^{-6}$ to about $1 \times 10^{-7}$ torr. During operation of the deposition process, process gas in a range of about 0.1 to 10 mTorr should be maintained; preferably process gas is maintained in a range of about 0.5 mTorr to about 5mTorr. Power applied should range between about 50 watts and about 10 kilowatts; preferably about 300 watts to about 3 kilowatts, using a target of about 8 inches in diameter.

Krypton gas is used as a process gas, preferably having a purity of at least 99.99%, most preferably about 99.999% pure.

Deposited film of any desired thickness may be produced. Deposited films having a thickness of about 1 $\mu$ to about 10 $\mu$ are preferred. In particular, films having a thickness of about 3.5 microns to about 4.5 microns are preferred.

Preferred ternary alloy films fabricated using the invented process are shape-memory alloys having a composition ranging between $Ni_{45}(TiHf)_{55}$ and $Ni_{55}(TiHf)_{45}$. Particularly preferred are ternary alloys having a composition between $Ni_{48}(TiHf)_{52}$ and $Ni_{50}(TiHf)_{50}$.

In order to accomplish fabrication of thin films, a target having elemental composition approximating that of the desired alloy film should be employed. The target may be an alloy material, or a hot pressed target. The hot pressed targets can be produced by placing mixed elements in a container and simultaneously applying high temperature and high pressure.

The following examples are provided to further describe the invention. The examples are intended to be illustrative and are not to be construed as limiting the scope of the invention.

EXAMPLE 1

Figure 1:
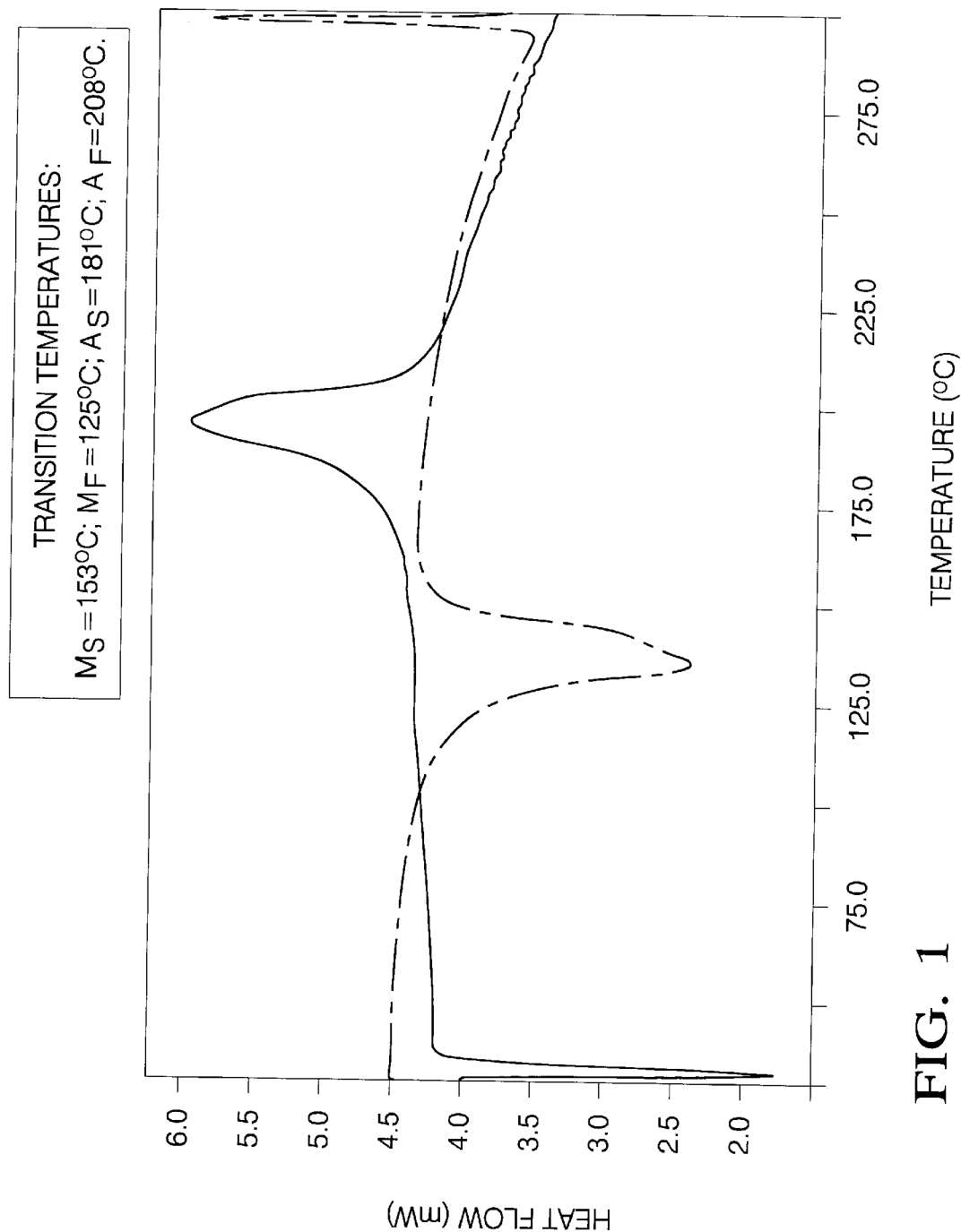
FIG. 1 is a graph depicting a plot of transformation temperatures of delaminated film deposited pursuant to the present invention, as measured by Differential Scanning Calorimetry.
Figure 2:
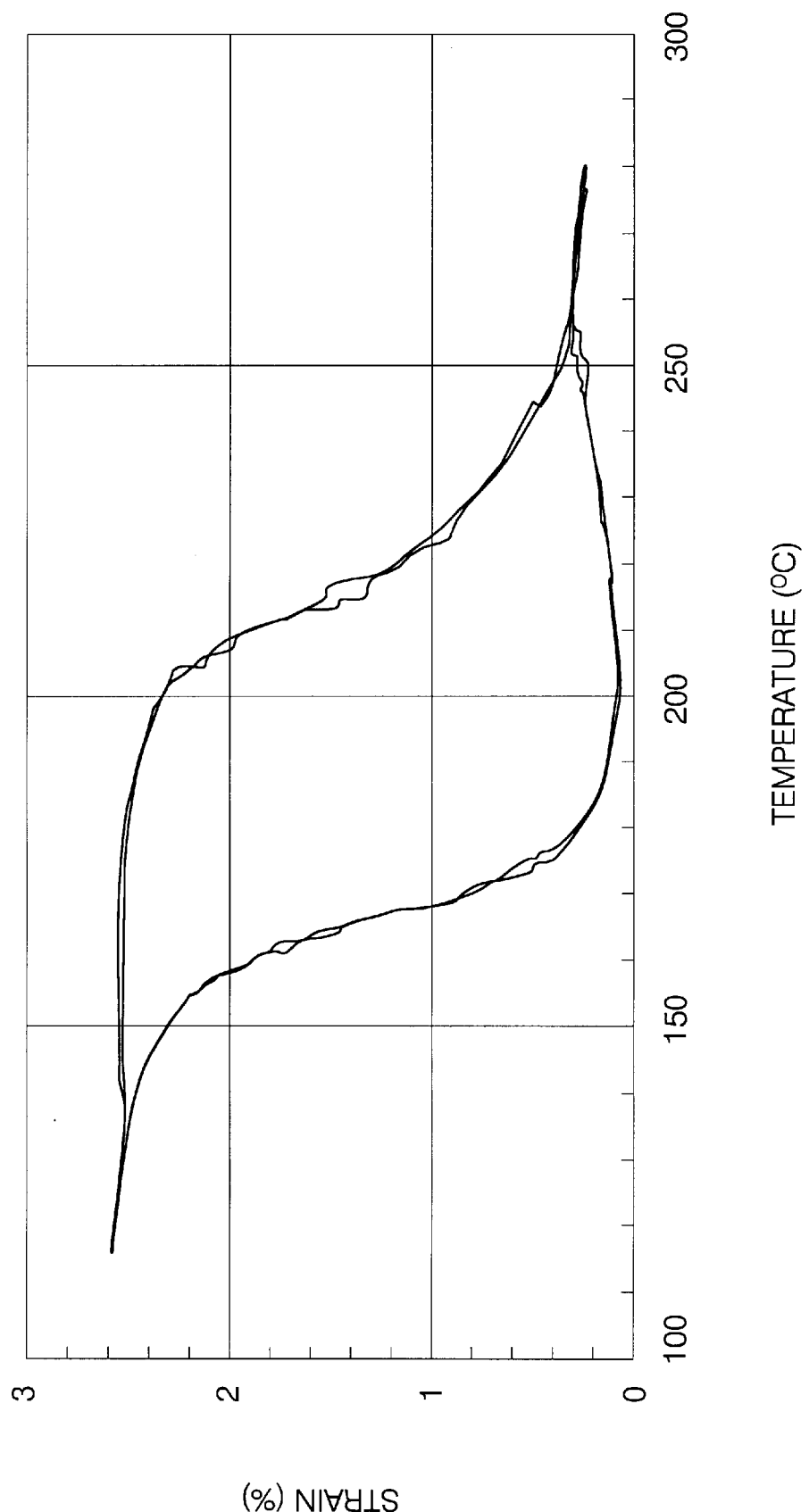
FIG. 2 is a graph depicting the strain-temperature curve of delaminated strips of film (under a constant stress) deposited pursuant to the present invention.

A 4.5 micron-thick film was sputter deposited on a 5 inch-diameter oxide passivated Si substrate from a $Ni_{48.5}Ti_{35.5}Hf_{16}$ hot pressed target by using krypton as working gas. Deposition parameters included: base pressure $5 \times 10^{-7}$ torr before deposition, Kr pressure 1.5 mTorr during deposition, target-to-substrate distance 3.7 inches, deposition power 1 kW, substrate temperature 430–440° C. and deposition time 51 minutes. To evaluate its mechanical and shape-memory properties, thin film was mechanically delaminated from the substrate. The transformation temperatures of delaminated film were measured by Differential Scanning Calorimetry (DSC) and the results are shown in FIG. 1. Also, mechanical and shape-memory properties were measured from 3 mm×60 mm strips. Room-temperature strength was measured. At strain rate of ~0.015/min, the fracture strength was over 550 MPa. Shape-memory properties were measured when the strips were thermally cycled under a constant stress. During thermal cycles between 100° C. to 300° C., the length change, or the strain output, of the strip was measured in a custom-built apparatus. The results are shown in FIG. 2. It was found at stresses as high as 350 MPa, as much as 2.5% strain resulted on cooling and fully recovered on heating. The maximum sustainable stress for thermal cycling was over 400 MPa. Table A shows the strain and its recoverability at different stresses during thermal cycles.

TABLE A

Shape-Memory Properties of a NiTiHf Film Under Different Stresses

| Stress (MPa) | 100 | 200 | 250 | 300 | 350 | 400 | 450 |
|---|---|---|---|---|---|---|---|
| Strain Resulted by Cooling (%) | 0.4 | 1.2 | 1.85 | 2.1 | 2.5 | 2.8 | 3.0 |
| Strain Recovered by Heating (%) | 0.4 | 1.2 | 1.85 | 2.1 | 2.5 | 2.7 | 2.6 |

COMPARATIVE EXAMPLE 2

Figure 3:
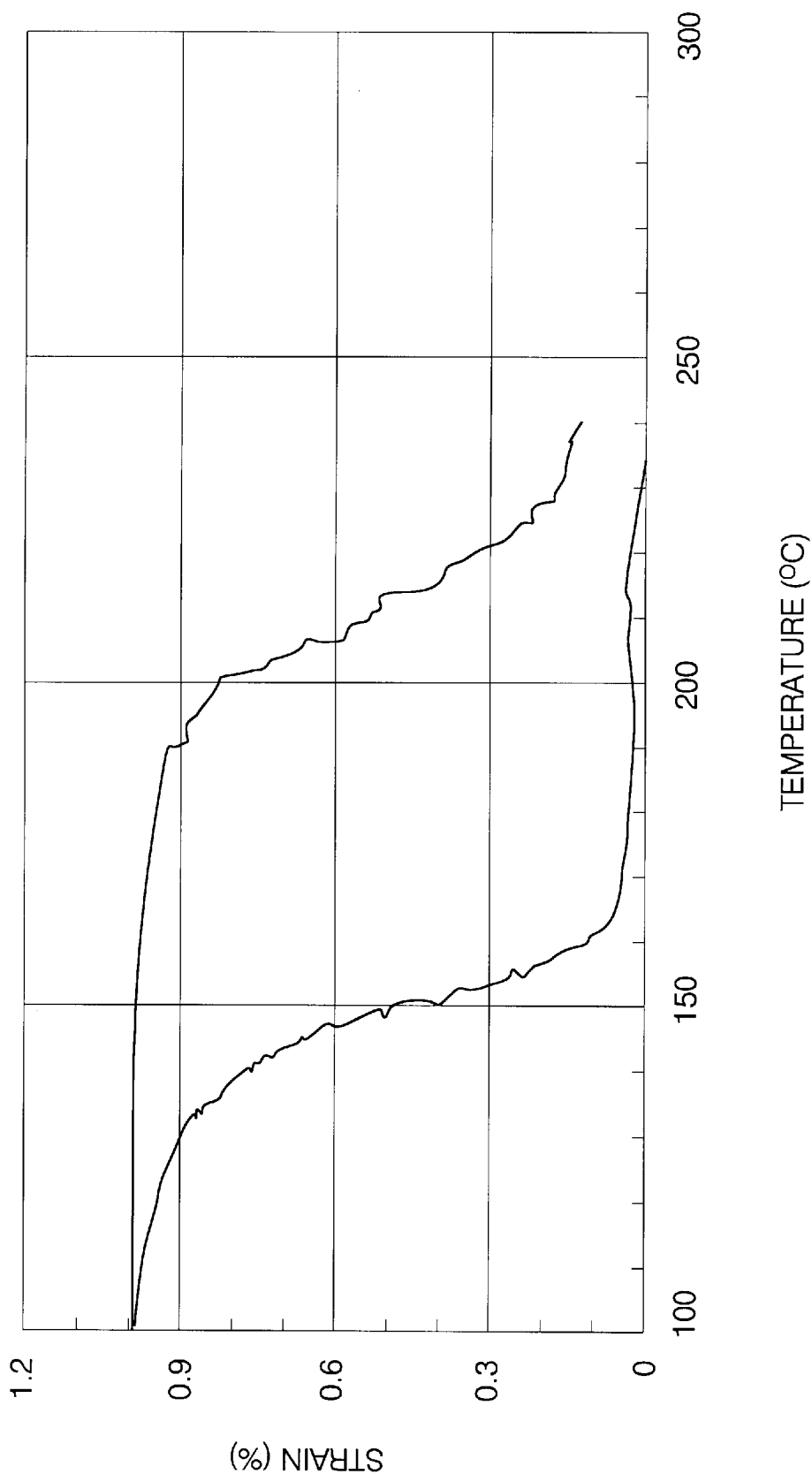
FIG. 3 is a graph depicting the strain output of a film (under a constant stress) deposited pursuant to the present invention.

Thin film deposition using argon as working gas was performed in the similar conditions as above except that the argon instead of krypton gas was introduced during deposition, and the deposition time could be about 2 minutes longer for the same thickness of the thin film. Likewise, freestanding film was needed for mechanical and shape-memory properties evaluation. It was found to be very difficult to get large pieces of free-standing thin film due to the brittleness of the as-deposited material. Transition temperatures, room temperature strength and shape-memory properties were measured by the same techniques as above except that the strip length was only 30 mm. While the transformation temperatures deviated less than 10° C., the fracture strength at the same strain rate was less than 350 MPa, and sustainable stress for thermal cycle was less than 250 MPa. FIG. 3 shows the strain output of a NiTiHf thin film made by using Ar as working gas during a thermal cycle. The strain on cooling was about ~1% and only 0.8%; was recovered on heating.

COMPARATIVE EXAMPLE 3

NiTi binary thin film depositions using Ar and Kr as working gases were performed from a $Ni_{47}Ti_{53}$ hot-pressed target. Deposition parameters were similar to those in ternary thin film deposition. Preliminary evaluation of thin film properties did not show major difference between films deposited using Kr and Ar as working gases in terms of transition temperatures and shape-memory effects. Key properties included: Ms temperatures were 40° C.~50° C., fully recoverable strain 4~5% and fully recoverable stress ~300–350 MPa.

As demonstrated by the above examples, ternary NiTiHf films were produced by the process of the present invention featuring martensite start points over 150° C. at stress free conditions. These films, as reported above, had room temperature strengths of over 550 MPa; a maximum recoverable stress of over 350 MPa; and, an over 2% recoverable strain with the fully recoverable temperature of 260° C. Comparable films produced using argon as the process gas produced films with room temperature strengths of about 350 MPa.

Various other embodiments or other modifications of the disclosed embodiments will be apparent to those skilled in the art upon reference to this description, or may be made without departing from the spirit and scope of the invention defined in the appended claims.

What is claimed:

1. A method for producing a thin film alloy deposit comprising:

conducting a sputtering deposition process with a target having a composition atomic ratio ranging from about $Ni_{45}(TiHf)_{55}$ to about $Ni_{55}(TiHf)_{45}$; and using krypton as a process gas, to produce a nickel titanium hafnium ternary shape-memory film alloy.

2. The process of claim 1 wherein a thin film deposit of a ternary shape-memory alloy is produced, using a sputtering deposition process employing a hot pressed target comprising nickel, titanium, and hafnium.

3. The process of claim 1 wherein the ternary alloy comprises a alloy having a composition ranging between $Ni_{48}(TiHf)_{52}$ and $Ni_{50}(TiHf)_{50}$.

4. The process of claim 1 wherein a thin film having a thickness of about 1 to about 10 microns is produced.

5. The process of claim 1 wherein the krypton gas has a purity of about 99.999 percent.

6. The process of claim 1 wherein the krypton gas is used in the sputtering deposition process at a pressure of about 0.5 mTorr to about 5 mTorr.

7. The process of claim 1 wherein the sputtering process is performed at an applied power of about 50 watts to about 10 kilowatts.

8. The process of claim 7 wherein the sputtering process is performed at an applied power of about 300 watts to about 3 Kilowatts.

9. A method for producing a thin film alloy deposit comprising:

conducting a sputtering deposition process using a substantially pure krypton gas as a process gas, and employing a hot pressed target comprising nickel, titanium and hafnium, to produce a nickel titanium hafnium ternary shape-memory film alloy.

* * * * *